(12) United States Patent
Liu et al.

(10) Patent No.: US 10,276,396 B2
(45) Date of Patent: Apr. 30, 2019

(54) METHOD FOR FORMING SEMICONDUCTOR DEVICE WITH DAMASCENE STRUCTURE

(71) Applicant: Taiwan Semiconductor Manufacturing Co., Ltd., Hsinchu (TW)

(72) Inventors: Hsiang-Wei Liu, Tainan (TW); Chia-Tien Wu, Taichung (TW); Wei-Chen Chu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/668,216

(22) Filed: Aug. 3, 2017

(65) Prior Publication Data

US 2019/0043730 A1 Feb. 7, 2019

(51) Int. Cl.
*H01L 21/48* (2006.01)
*H01L 21/033* (2006.01)
*H01L 21/308* (2006.01)
*H01L 21/768* (2006.01)
*H01L 21/3105* (2006.01)
*H01L 21/3213* (2006.01)

(52) U.S. Cl.
CPC .... *H01L 21/31055* (2013.01); *H01L 21/0337* (2013.01); *H01L 21/3086* (2013.01); *H01L 21/3213* (2013.01); *H01L 21/485* (2013.01); *H01L 21/486* (2013.01); *H01L 21/4857* (2013.01); *H01L 21/76843* (2013.01)

(58) Field of Classification Search
CPC .............. H01L 21/486; H01L 21/0337; H01L 21/0338; H01L 21/3213; H01L 21/485; H01L 21/3086; H01L 21/4857; H01L 21/76802; H01L 21/76877; H01L 21/76843; H01L 23/485; H01L 21/31055
See application file for complete search history.

(56) References Cited

U.S. PATENT DOCUMENTS 6,312,874 B1 * 11/2001 Chan ................. H01L 21/31116
257/E21.035

* cited by examiner

*Primary Examiner* — Jasmine J Clark
(74) *Attorney, Agent, or Firm* — Birch, Stewart, Kolasch & Birch, LLP

(57) ABSTRACT

A method for forming a semiconductor device structure includes forming a first dielectric layer over a semiconductor substrate and forming an etch stop layer with a hole over the first dielectric layer. The method also includes forming a second dielectric layer over the etch stop layer and forming a first mask element with a trench opening over the second dielectric layer. The method further includes forming a second mask element over the first mask element, and the second mask element has a via opening. In addition, the method includes etching the second dielectric layer through the via opening and etching the second dielectric layer through the trench opening. As a result, a trench and a via hole are formed in the second dielectric layer and the first dielectric layer, respectively. The method includes forming a conductive material in the via hole and the trench.

20 Claims, 6 Drawing Sheets

METHOD FOR FORMING SEMICONDUCTOR DEVICE WITH DAMASCENE STRUCTURE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying FIGURES. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
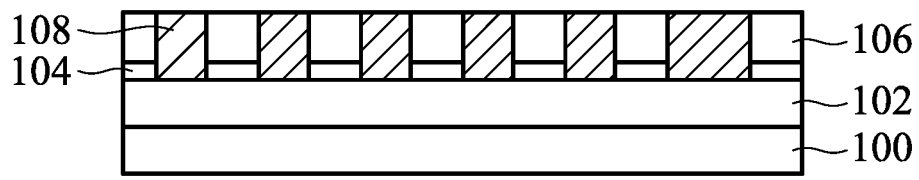
FIGS. 1A-1L are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIGURES. The spatially relative terms are intended to encompass different orientations of the device in use or operation in addition to the orientation depicted in the FIGURES. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1L are cross-sectional views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, trench isolation (STI) features or local oxidation of silicon (LOCOS) features.

In some embodiments, various device elements are formed in and/or on the semiconductor substrate 100. Examples of the various device elements that may be formed in the semiconductor substrate 100 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, one or more other applicable processes, or a combination thereof.

In some embodiments, a dielectric layer 102 is formed on the semiconductor substrate 100, as shown in FIG. 1A. The dielectric layer 102 may include multiple sub-layers. The dielectric layer 102 may include or be made of carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof. In some embodiments, multiple conductive features (not shown) are formed in the dielectric layer 102. The conductive features may include conductive contacts, conductive lines, and/or conductive vias. The dielectric layer 102 and the conductive features formed therein are a portion of an interconnection structure that will be subsequently formed.

The device elements in and/or on the semiconductor substrate 100 will be interconnected through the interconnection structure to be formed over the semiconductor substrate 100. As a result, integrated circuit devices are formed. The integrated circuit devices may include logic devices, memory devices (e.g., static random access memories, SRAMs), radio frequency (RF) devices, input/output (I/O) devices, system-on-chip (SoC) devices, image sensor devices, one or more other applicable types of devices, or a combination thereof.

In some embodiments, conductive features 108 are formed over the dielectric layer 102, as shown in FIG. 1A. In some embodiments, each of the conductive features 108 is a conductive line electrically connected to a corresponding device element. For example, conductive contacts (not shown) are used to form electrical connections between the device elements and the conductive features 108. In some embodiments, the conductive features 108 are made of or include copper, cobalt, aluminum, gold, titanium, tungsten, ruthenium, graphene, one or more other suitable conductive materials, or a combination thereof.

In some embodiments, an etch stop layer 104 surrounds lower portions of the conductive features 108, as shown in FIG. 1A. In some embodiments, a dielectric layer 106 is formed over the etch stop layer 104. Photolithography and etching processes may be used to form trenches in the dielectric layer 106 and the etch stop layer 104. Afterwards, processes involving conductive material filling and planarization may be performed to form the conductive features 108 in the trenches.

Figure 1B:
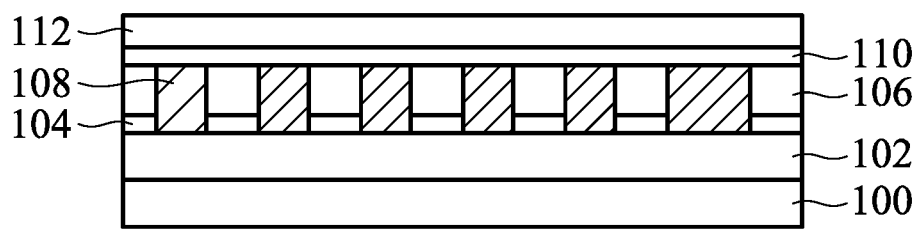

As shown in FIG. 1B, an etch stop layer 110 is deposited over the dielectric layer 106 and the conductive features 108, in accordance with some embodiments. In some embodiments, the etch stop layer 110 is made of or includes silicon carbide (SiC), nitrogen-doped silicon carbide, oxygen-doped silicon carbide, silicon nitride (SiN), silicon oxynitride (SiON), silicon oxide, aluminum oxide, aluminum oxynitride, one or more other suitable materials, or a combination thereof. In some embodiments, the etch stop layer 110 has a thickness in a range from about 10 Å to about 100 Å. In some embodiments, the etch stop layer 110 is deposited using a chemical vapor deposition (CVD) process, a physical vapor deposition (PVD) process, a spin-on process, an atomic layer deposition (ALD) process, one or more other applicable processes, or a combination thereof.

Many variations and/or modifications can be made to embodiments of the disclosure. In some other embodiments, the etch stop layer 110 is not formed.

Afterwards, a dielectric layer 112 is deposited over the etch stop layer 110, as shown in FIG. 1B in accordance with some embodiments. The dielectric layer 112 serves as an inter-metal dielectric (IMD) layer. In some embodiments, the dielectric layer 112 is made of or includes a low-k dielectric material. The low-k dielectric material has a dielectric constant smaller than that of silicon dioxide. For example, the low-k dielectric material has a dielectric constant in a range from about 1.2 to about 3.5.

As the density of semiconductor devices increases and the size of circuit elements becomes smaller, the resistance capacitance (RC) delay time increasingly dominates circuit performance. Using a low-k dielectric material as the dielectric layer 104 is helpful for reducing the RC delay.

In some embodiments, the dielectric layer 112 is made of or includes a porous dielectric material, a spin-on inorganic dielectric, a spin-on organic dielectric, an organic polymer, an organic silica glass, SiOF series material, a hydrogen silsesquioxane (HSQ) series material, a methyl silsesquioxane (MSQ) series material, a porous organic series material, another suitable material, or a combination thereof. In some embodiments, the dielectric layer 112 includes a material containing Si, C, O, or H. For example, the dielectric layer 112 includes SiOC, $SiO_2$, SiON, SiCOH, SiOCN, or a combination thereof. In some embodiments, the dielectric layer 112 is made of or includes carbon-doped silicon oxide. The carbon-doped silicon oxide may also be referred to as organosilicate glass (OSG) or C-oxide. In some embodiments, the dielectric layer 112 is deposited using a CVD process, an atomic layer deposition (ALD) process, a spin-on process, a spray coating process, one or more other applicable processes, or a combination thereof.

Figure 1C:
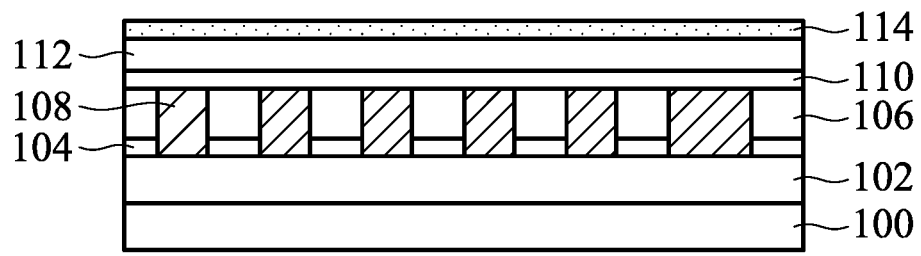

As shown in FIG. 1C, an etch stop layer 114 is deposited over the dielectric layer 112, in accordance with some embodiments. The material and formation method of the etch stop layer 114 may be the same as or similar to those of the etch stop layer 110. However, embodiments of the disclosure are not limited thereto. In some other embodiments, the etch stop layer 114 and the etch stop layer 110 are made of different materials. In some embodiments, the etch stop layer 114 is made of or includes silicon nitride, aluminum oxynitride, aluminum oxide, silicon carbide (SiC), nitrogen-doped silicon carbide, oxygen-doped silicon carbide, silicon oxynitride (SiON), silicon oxide, one or more other suitable materials, or a combination thereof. In some embodiments, the etch stop layer 114 has a thickness that is in a range from about 1 nm to about 10 nm.

Figure 1D:
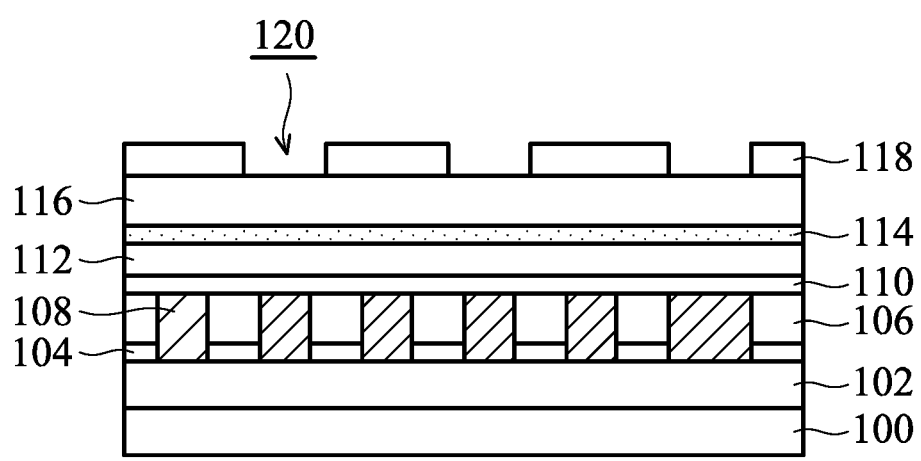

As shown in FIG. 1D, a planarization layer 116 is deposited over the etch stop layer 114, in accordance with some embodiments. The planarization layer 116 provides a substantially planar top surface to facilitate a subsequent patterning process. The planarization layer 116 may also function as an anti-reflection layer during the subsequent patterning process. The planarization layer 116 may be made of or include a polymer-containing material. In some embodiments, the planarization layer 116 is deposited using a spin-on process, a CVD process, one or more other applicable processes, or a combination thereof.

Many variations and/or modifications can be made to embodiments of the disclosure. In some other embodiments, the planarization layer 116 is not formed.

Afterwards, a mask element 118 is formed over the planarization layer 116, as shown in FIG. 1D in accordance with some embodiments. In some embodiments, a mask layer is deposited over the planarization layer 116. Afterwards, the mask layer is partially removed to form openings 120. The remaining portions of the mask layer form the mask element 118.

In some embodiments, the mask element 118 is a patterned photoresist layer. In some embodiments, the patterned photoresist layer contains metal. In some embodiments, the mask element 110 is a metal-containing organic-inorganic hybrid. For example, the mask element 118 is made of a mixture of one or more polymer materials and one or more inorganic materials. The inorganic materials may include zirconium oxide, titanium oxide, one or more other suitable materials, or a combination thereof.

A photolithography process may be used to form the mask element 118. The photolithography process may include photoresist coating (e.g., spin-on coating), soft baking, mask aligning, exposure (e.g., extreme ultra-violet light illumination), post-exposure baking, developing the photoresist, rinsing, drying (e.g., hard baking), one or more other suitable operations, or a combination thereof.

Figure 1E:
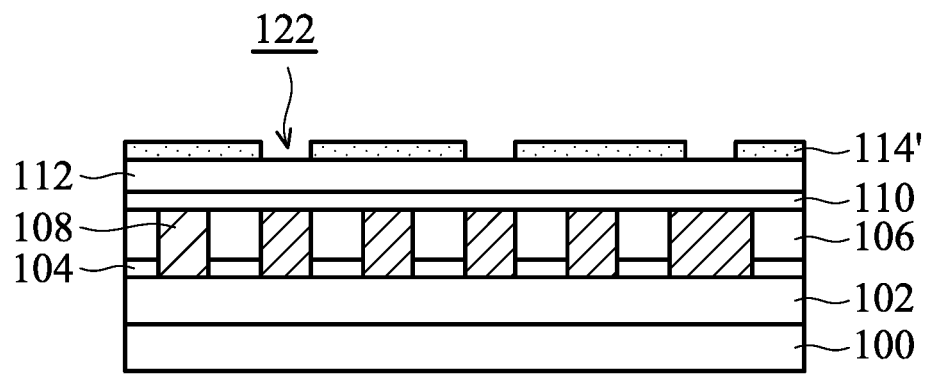

As shown in FIG. 1E, the etch stop layer 114 is partially removed to form a patterned etch stop layer 114', in accordance with some embodiments. In some embodiments, the patterned etch stop layer 114' includes multiple holes 122, as shown in FIG. 1E. Each of the holes 122 defined by the patterned etch stop layer 114' may be substantially aligned with the corresponding conductive feature 108 thereunder. In some embodiments, the etch stop layer 114 is partially removed using an etching process.

In some embodiments, the etch stop layer 114 is etched through the openings 120 of the mask element 118. Due to the etching process, each of the openings 120 extends downwards into the planarization layer 116 and the etch stop layer 114. As a result, the holes 122 are formed, the patterned etch stop layer 114' is obtained. Afterwards, the remaining portions of the mask element 118 and the planarization layer 116 may be removed using an ashing process, a wet striping process, one or more other applicable processes, or a combination thereof.

Figure 1F:
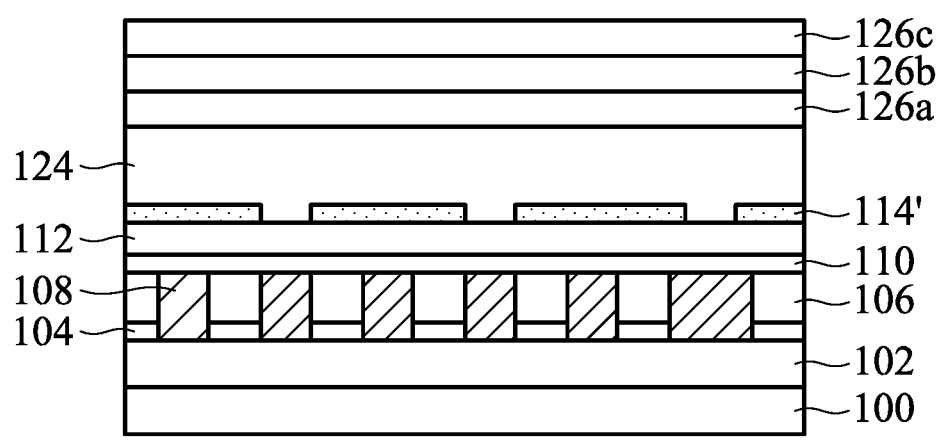

As shown in FIG. 1F, a dielectric layer 124 is deposited over the patterned etch stop layer 114' and the dielectric layer 112, in accordance with some embodiments. The dielectric layer 124 may fill the holes 122 of the patterned etch stop layer 114'. The material and formation method of the dielectric layer 124 may be the same as or similar to those of the dielectric layer 112. In some embodiments, a planarization process is performed on the dielectric layer 124 to planarize the dielectric layer 124. The planarization process may include a chemical mechanical polishing (CMP) process, a grinding process, a dry polishing process, an etching process, one or more other applicable processes, or a combination thereof.

In some embodiments, the dielectric layer 124 is thicker than the dielectric layer 112. In some other embodiments, the dielectric layer 124 is substantially as thick as the dielectric layer 112. The thickness ratio of the dielectric layer 124 to the dielectric layer 112 may be in a range from about 1 to about 1.2.

Afterwards, a stack of mask layers is formed over the dielectric layer 124, as shown in FIG. 1F in accordance with some embodiments. The stack may include mask layers 126a, 126b, and 126c. In some embodiments, the mask layer 126a is a planarization layer. The material and formation method of the mask layer 126a may be the same as or similar to those of the planarization layer 116. In some embodiments, the mask layer 126b is a metal-containing layer. The mask layer 126b may be made of or include titanium nitride, tantalum nitride, one or more other suitable materials, or a combination thereof. In some embodiments, the mask layer 126c is made of or includes an oxide material. For example, the mask layer 126c is a TEOS layer.

Figure 1G:
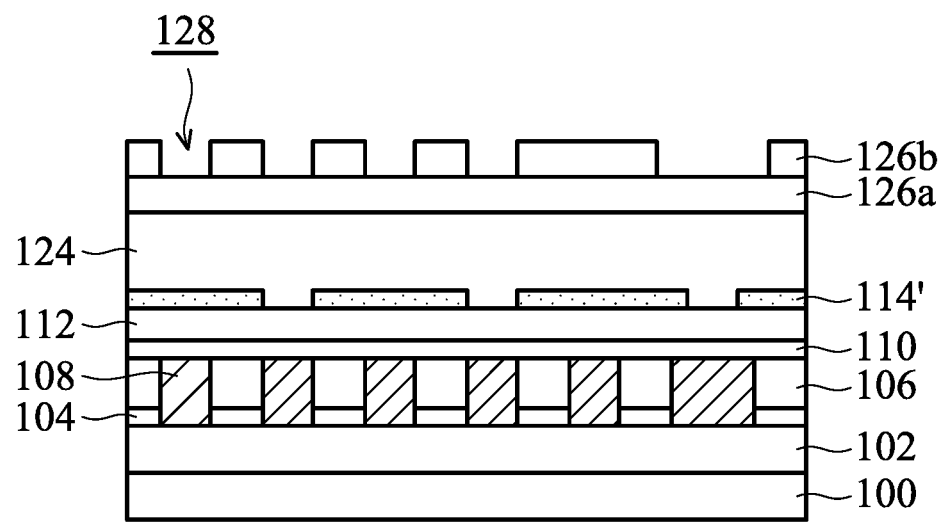

As shown in FIG. 1G, trench openings 128 are formed in the mask layer 126b, in accordance with some embodiments. The trench openings 128 are used to define positions and shapes of trenches that will be formed in the dielectric layer 124. The trenches may be used to contain conductive lines. Photolithography and etching processes may be used to pattern the mask layer 126b. The patterning process may involve a self-aligned double patterning process, a self-aligned quadruple patterning process, one or more other applicable processes, or a combination thereof. After the formation of the trench openings 128, the mask layers 126b and 126a may together serve as a mask element.

Figure 1H:
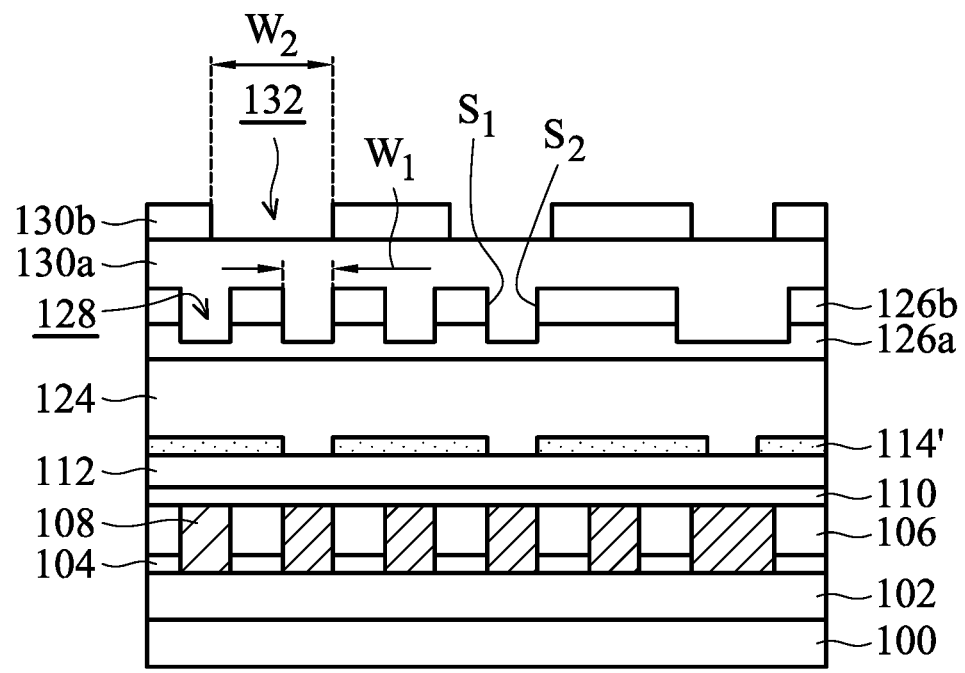

In some embodiments, an etching process is used to slightly etch the mask layer 126a through the trench openings 128, as shown in FIG. 1H. Afterwards, a planarization layer 130a is deposited over the mask element constructed by the mask layers 126a and 126b, as shown in FIG. 1H in accordance with some embodiments. The material and formation method of the planarization layer 130a may be the same as or similar to those of the planarization layer 116. The planarization layer 130a has a substantially planar top surface, which may facilitate a subsequent patterning process.

Many variations and/or modifications can be made to embodiments of the disclosure. In some other embodiments, the planarization layer 116 is not formed.

Afterwards, a mask element 130b is formed over the planarization layer 130a, as shown in FIG. 1H in accordance with some embodiments. The mask element 130b has via openings 132. The material and formation method of the mask element 130b may be the same as or similar to those of the mask element 118. The via openings 132 may be used to define via holes in the dielectric layer 124.

In some embodiments, each of the via openings 132 is substantially aligned with the corresponding hole 122 of the etch stop layer 114'. In some embodiments, one or each of the via openings 132 partially overlaps the corresponding trench opening 128 thereunder. In some embodiments, one or each of the via openings 132 extends across sidewalls (such as sidewalls $S_1$ and $S_2$) of the corresponding trench opening 128 thereunder. In some embodiments, one or each of the via openings 132 is wider than the corresponding trench opening 128 thereunder.

Figure 1I:
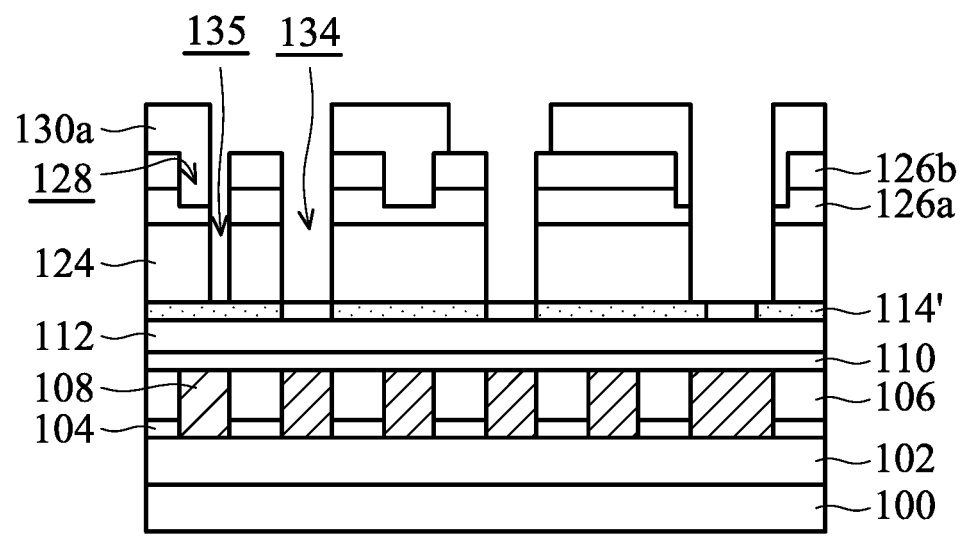

As shown in FIG. 1I, the dielectric layer 124 is etched through the via openings 132 of the mask element 130b to form via holes 134 in the dielectric layer 124, in accordance with some embodiments. The etching process for forming the via holes 134 may include a dry etching process, a wet etching process, or a combination thereof. In some embodiments, the mask element 130b is removed during the etching process for forming the via holes 134. During the etching of the dielectric layer 124, the mask element 130b is also consumed.

In some cases, since there are many different material layers between the mask element 130b and the dielectric layer 124, overlay shift may occur during the formation of the via openings 132. As a result, an unexpected hole 135 (that is not intended to be formed) may be formed in the dielectric layer 124, as shown in FIG. 1I. Due to the patterned etch stop layer 114', the hole 135 is stopped above the patterned etch stop layer 114' without extending into the dielectric layer 112 thereunder. A portion of the planarization layer 130a directly below the via openings 132 may also be removed during the etching process. Afterwards, the remaining portions of the planarization layer 130a are removed to expose the mask element constructed by the mask layers 126a and 126b.

Figure 1J:
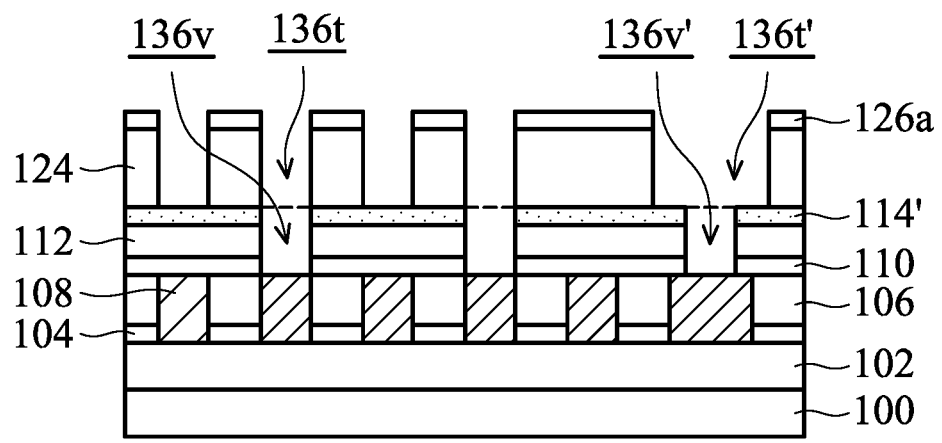

As shown in FIG. 1J, the dielectric layer 124 is etched through the trench openings 128 of the mask element constructed by the mask layers 126a and 126b to form trenches 136t in the dielectric layer 124, in accordance with some embodiments. In some embodiments, the mask layer 126b is consumed during the etching process for forming the trenches 136t. During the etching process, the via holes 134 originally formed in the dielectric layer 124 extend into the dielectric layer 112 through the holes 122 of the patterned etch stop layer 114'. As a result, via holes 136v are formed in the dielectric layer 112, as shown in FIG. 1J in accordance with some embodiments.

As shown in FIG. 1J, the unexpected hole 135 becomes a portion of one of the trenches 136t. Due to the patterned etch stop layer 114', the hole 135 is prevented from extending into the dielectric layer 112 during the formation of the trenches 136t. There is substantially no unexpected hole formed in the dielectric layer 112 to negatively affect subsequent formation of conductive features.

As shown in FIG. 1J, one or more trenches 136t' with greater widths than the trenches 136t are also formed in the dielectric layer 124, in accordance with some embodiments. One or more via holes 136v' are also formed in the dielectric layer 112, as shown in FIG. 1J. Due to the patterned etch stop layer 114', the trenches 136t' with greater widths are prevented from extending into the dielectric layer 112. Therefore, the trenches 136t and 136t' may have substantially the same depth.

Figure 1K:
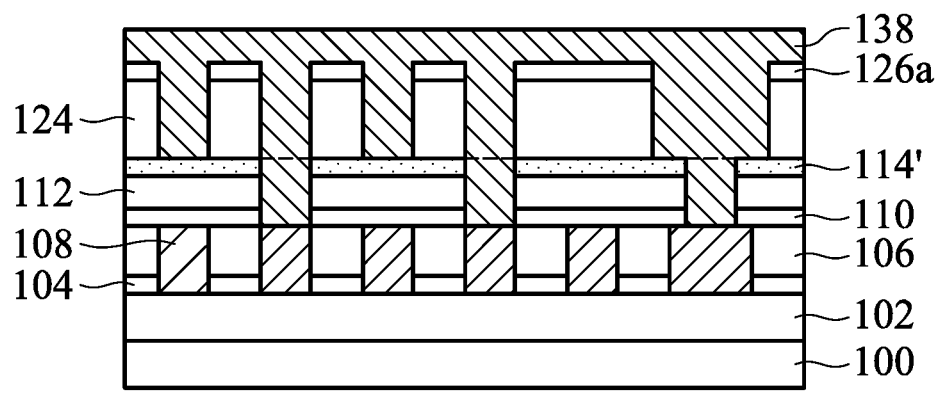

As shown in FIG. 1K, one (or more) conductive material 138 is formed over the dielectric layer 124 to fill the trenches 136t and 136t' and the via holes 136v and 136v', in accordance with some embodiments. The conductive material 138 may be made of or include copper (Cu), ruthenium (Ru), aluminum (Al), aluminum-copper alloy, cobalt (Co), tungsten (W), titanium, graphene, one or more other suitable materials, or a combination thereof. The conductive material 138 may be formed using a CVD process, an electroplating process, a PVD process, an electroless plating process, one or more other applicable processes, or a combination thereof.

In some other embodiments, one or more other layers are formed over sidewalls of the trenches and via holes formed in the dielectric layers 124 and 112. For example, a barrier layer (not shown) may be formed before the formation of the conductive material 138. The barrier layer may be made of or include titanium nitride, tantalum nitride, one or more other suitable materials, or a combination thereof.

Figure 1L:
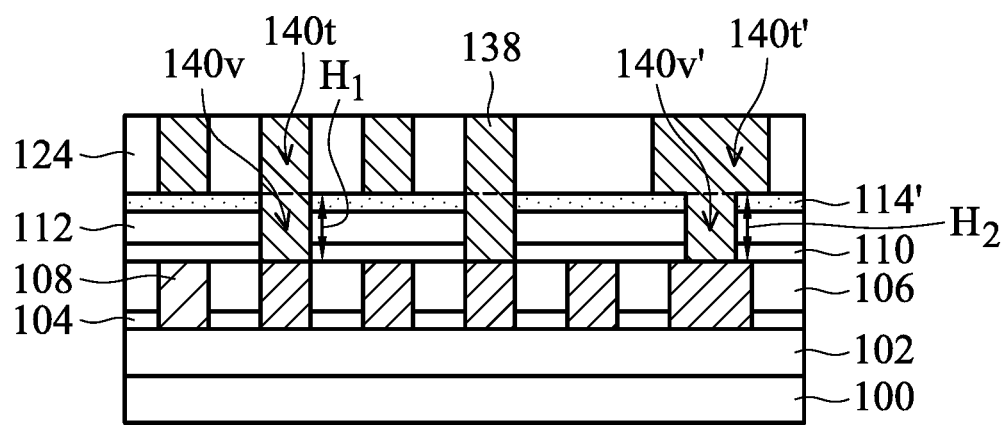

As shown in FIG. 1L, a planarization process is used to remove the conductive material 138 and the mask layer 126a outside of the trenches 136t and 136t', in accordance with some embodiments. The planarization process may include a CMP process, a grinding process, a dry polishing process, an etching process, one or more other applicable processes, or a combination thereof. As a result, the remaining portions of the conductive material 138 in the trenches 136t and 136t' form conductive lines 140t and 140t'. The remaining portions of the conductive material 138 in the via holes 136v and 136v' form conductive vias 140v and 140v', respectively.

In some embodiments, a top view of the conductive via 140v or 140v' has a rectangular shape, a round shape, or another suitable shape. The width of the conductive via 140v or 140v' may be in a range from about 5 nm to about 35 nm. In some embodiments, a top view of the conductive line 140t or 140t' has a rectangular shape. In some embodiments, the conductive line 140t has a width substantially the same as that of the conductive via 140v. In some embodiments, the conductive line 140t has a length (measured along a direction perpendicular to the width direction) that is greater than that of the conductive via 140v. In some embodiments, the width of the conductive line 140t is in a range from about 5 nm to about 50 nm. In some embodiments, a distance between two neighboring conductive lines 140t is in a range from about 5 nm to about 50 nm.

As mentioned above, due to the patterned etch stop layer 114', the trenches 140t' which is wider than the trenches 140t are prevented from extending into the dielectric layer 112. Therefore, the conductive via 140v' is substantially as high as the conductive via 140v. As shown in FIG. 1L, the conductive vias 140v and 140v' has heights $H_1$ and $H_2$, respectively. The heights $H_1$ and $H_2$ are substantially the same. The height $H_1$ or $H_2$ may be in a range from about 5 nm to about 50 nm. The trench loading issue is reduced or prevented. The quality of the conductive vias 140v' may be maintained. Conductive lines above and below the conductive via 140v' are separated from each other by a suitable distance.

As mentioned above, the unexpected hole 135 (that is not intended to be formed) may be formed in the dielectric layer 124 due to overlay shift. Because of the patterned etch stop layer 114', the hole 135 is prevented from extending into the dielectric layer 112 thereunder. No unexpected via hole is formed in the dielectric layer 112. Therefore, there is also no unexpected conductive via or conductive element formed between the conductive lines 140t and the conductive features 108 during the formation of the conductive material 138. The shortage risk is reduced or prevented.

Embodiments of the disclosure form a semiconductor device structure with a damascene structure. A patterned etch stop layer is formed between a lower and an upper dielectric layers. The patterned etch stop layer has holes defining positions of conductive vias to be formed in the lower dielectric layer. Multiple mask elements are formed over the upper dielectric layer to assist in subsequent via hole formation and trench formation. Due to the patterned etch stop layer, the positions of via holes are confined even if an overlay shift might occur. The quality and precision of the damascene structure are improved accordingly.

In accordance with some embodiments, a method for forming a semiconductor device structure is provided. The method includes forming a first dielectric layer over a semiconductor substrate and forming an etch stop layer with a hole over the first dielectric layer. The method also includes forming a second dielectric layer over the etch stop layer and forming a first mask element with a trench opening over the second dielectric layer. The method further includes forming a second mask element over the first mask element, and the second mask element has a via opening. In addition, the method includes etching the second dielectric layer through the via opening of the second mask element to form a via hole in the second dielectric layer. The method includes etching the second dielectric layer through the trench opening of the first mask element to form a trench in the second dielectric layer such that the via hole extends into the first dielectric layer through the hole of the etch stop layer. The method also includes forming a conductive material in the via hole and the trench.

In accordance with some embodiments, a method for forming a semiconductor device structure is provided. The method includes forming a first dielectric layer over a semiconductor substrate and forming a patterned etch stop layer over the first dielectric layer. The method also includes forming a second dielectric layer over the patterned etch stop layer and forming a first mask element and a second mask element over the second dielectric layer. The first mask element and the second mask element define a trench opening and a via opening, respectively. The method further includes etching the second dielectric layer through the via opening and etching the second dielectric layer through the trench opening. As a result, a trench is formed in the second dielectric layer and a via hole is formed in the first dielectric layer. In addition, the method includes forming a conductive line and a conductive via in the trench and the via hole, respectively.

In accordance with some embodiments, a method for forming a semiconductor device structure is provided. The method includes forming a first dielectric layer over a semiconductor substrate and forming a patterned etch stop layer over the first dielectric layer. The method also includes forming a second dielectric layer over the patterned etch stop layer and forming a first mask element over the second dielectric layer. The first mask element defines multiple trench openings. The method further includes forming a planarization layer over the first mask element and forming a second mask element over the planarization layer. The second mask element defines multiple via openings. In addition, the method includes etching the second dielectric layer through the via openings to form via holes in the second dielectric layer and etching the second dielectric layer through the trench openings. As a result, trenches are formed in the second dielectric layer, and the via holes extend into the first dielectric layer. The method includes filling a conductive material in the trenches and the via holes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first dielectric layer over a semiconductor substrate;
    forming an etch stop layer with a hole over the first dielectric layer;
    forming a second dielectric layer over the etch stop layer and into the hole of the etch stop layer;
    forming a first mask element with a trench opening over the second dielectric layer;
    forming a second mask element over the first mask element, wherein the second mask element has a via opening;
    etching the second dielectric layer through the via opening of the second mask element to form a via hole in the second dielectric layer;
    etching the second dielectric layer through the trench opening of the first mask element to form a trench in the second dielectric layer such that the via hole extends into the first dielectric layer through the hole of the etch stop layer; and
    forming a conductive material in the via hole and the trench.

2. The method for forming a semiconductor device structure as claimed in claim 1, wherein the hole of the etch stop layer is substantially aligned with a conductive line formed below the first dielectric layer.

3. The method for forming a semiconductor device structure as claimed in claim 1, wherein the via opening of the second mask element is substantially aligned with the hole of the etch stop layer.

4. The method for forming a semiconductor device structure as claimed in claim 1, further comprising forming a planarization layer over the first mask element before the second mask element is formed, wherein the planarization layer has a substantially planar top surface.

5. The method for forming a semiconductor device structure as claimed in claim 4, further comprising removing the planarization layer after etching the second dielectric layer through the via opening of the second mask element and before etching the second dielectric layer through the trench opening of the first mask element.

6. The method for forming a semiconductor device structure as claimed in claim 1, wherein the second mask element is removed during the etching of the second dielectric layer through the via opening of the second mask element.

7. The method for forming a semiconductor device structure as claimed in claim 1, wherein the via opening of the second mask element extends across sidewalls of the trench opening of the first mask element.

8. The method for forming a semiconductor device structure as claimed in claim 1, wherein the via opening of the second mask element partially overlaps the trench opening of the first mask element.

9. The method for forming a semiconductor device structure as claimed in claim 1, wherein the second dielectric layer is thicker than the first dielectric layer.

10. The method for forming a semiconductor device structure as claimed in claim 1, further comprising performing a planarization process to remove the conductive material outside of the trench.

11. A method for forming a semiconductor device structure, comprising:
    forming a first dielectric layer over a semiconductor substrate;
    forming a patterned etch stop layer over the first dielectric layer;
    forming a second dielectric layer over the patterned etch stop layer and into a hole of the patterned etch stop layer;
    forming a first mask element and a second mask element over the second dielectric layer, wherein the first mask element and the second mask element define a trench opening and a via opening, respectively;
    etching the second dielectric layer through the via opening;
    etching the second dielectric layer through the trench opening such that a trench is formed in the second dielectric layer and a via hole is formed in the first dielectric layer; and
    forming a conductive line and a conductive via in the trench and the via hole, respectively.

12. The method for forming a semiconductor device structure as claimed in claim 11, wherein during the etching of the second dielectric layer through the trench opening, the first dielectric layer is etched through the hole of the patterned etch stop layer to form the via hole in the first dielectric layer.

13. The method for forming a semiconductor device structure as claimed in claim 12, wherein the via opening defined by the second mask element is substantially aligned with the hole of the patterned etch stop layer.

14. The method for forming a semiconductor device structure as claimed in claim 11, wherein the via opening defined by the second mask element partially overlaps the trench opening defined by the first mask element.

15. The method for forming a semiconductor device structure as claimed in claim 11, further comprising forming a planarization layer over the first mask element before the second mask element is formed, wherein the planarization layer has a substantially planar top surface.

16. A method for forming a semiconductor device structure, comprising:
    forming a first dielectric layer over a semiconductor substrate;

forming a patterned etch stop layer over the first dielectric layer;

forming a second dielectric layer over the patterned etch stop layer;

forming a first mask element over the second dielectric layer, wherein the first mask element defines a plurality of trench openings;

forming a planarization layer over the first mask element;

forming a second mask element over the planarization layer, wherein the second mask element defines a plurality of via openings;

etching the second dielectric layer through the via openings to form via holes in the second dielectric layer;

etching the second dielectric layer through the trench openings such that trenches are formed in the second dielectric layer and the via holes extend into the first dielectric layer; and filling a conductive material in the trenches and the via holes.

17. The method for forming a semiconductor device structure as claimed in claim 16, wherein during the etching of the second dielectric layer through the trench opening, the first dielectric layer is etched through holes of the patterned etch stop layer.

18. The method for forming a semiconductor device structure as claimed in claim 17, wherein the via openings defined by the second mask element are substantially aligned with the holes of the patterned etch stop layer.

19. The method for forming a semiconductor device structure as claimed in claim 17, further comprising removing the planarization layer before etching the second dielectric layer through the trench openings and after etching the second dielectric layer through the via openings to form via holes in the second dielectric layer.

20. The method for forming a semiconductor device structure as claimed in claim 16, wherein the trenches has a first trench and a second trench, the second trench is wider than the first trench, and the second trench is substantially as deep as the first trench.

* * * * *